United States Patent [19]

Conrad

[11] Patent Number: 4,742,428
[45] Date of Patent: May 3, 1988

[54] PROTECTIVE RELAY AND DRAWOUT CASE THEREFOR

[75] Inventor: Richard Conrad, Langhorne, Pa.

[73] Assignee: BBC Brown Boveri Inc., White Plains, N.Y.

[21] Appl. No.: 65,427

[22] Filed: Jun. 23, 1987

[51] Int. Cl.⁴ .............................................. H01H 9/20
[52] U.S. Cl. ............................. 361/336; 200/50 AA; 361/395
[58] Field of Search .............. 337/2, 4, 5; 200/50 AA; 307/115, 147; 361/115, 334–339, 343, 356, 358, 395, 399, 425, 391

[56] References Cited

U.S. PATENT DOCUMENTS 4,477,701 10/1984 Castonguay .................. 200/50 AA
4,703,137 10/1987 Bohnen ............................... 361/337

*Primary Examiner*—G. P. Tolin
*Attorney, Agent, or Firm*—Ostrolenk, Faber, Gerb & Soffen

[57] ABSTRACT

Protective relay apparatus is constructed of an operating unit that is withdrawable from its insulating housing through an opening at the front thereof. A plurality of sets of shorting contacts and a plurality of plug-type disconnect contacts are mounted to the rear wall of the housing and extend forward therefrom. Mounted on the drawout unit rear panel are a plurality of receptacle-type contacts that receive and cooperate with the disconnect contacts when the drawout unit is inserted fully within the housing. At that time blade means mounted in the drawout unit are interposed between contact sections of the respective sets of shorting contacts to separate contact portions of the latter. Each blade means includes an insulating layer interposed between conducting layers that are engaged with the respective contact sections of the shorting contacts to connect these contact sections in circuit with lumped elements forming part of the drawout unit. The elements of the cooperating disconnect contacts and the shorting contacts with their respective cooperating blade means are constructed and operatively positioned so that contact making and breaking is in a predetermined sequence that protects circuit elements from damage and eliminates false tripping.

10 Claims, 5 Drawing Sheets

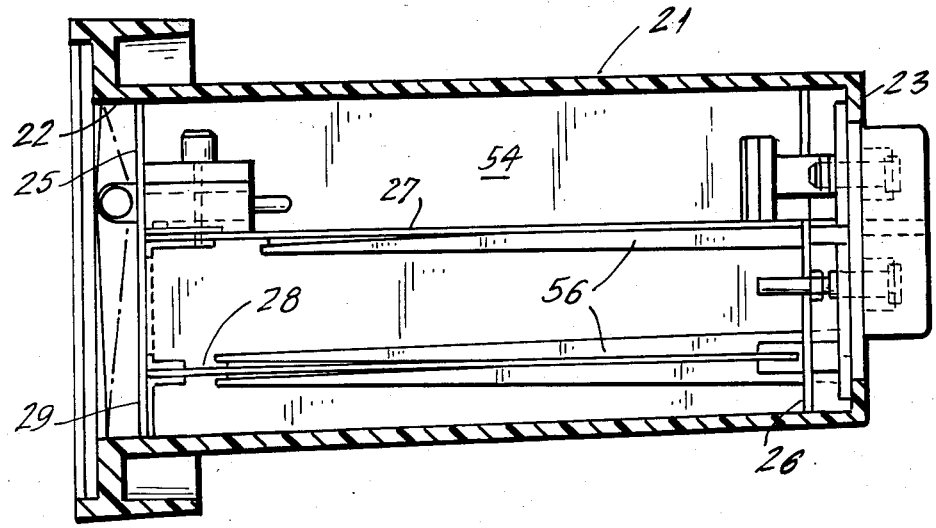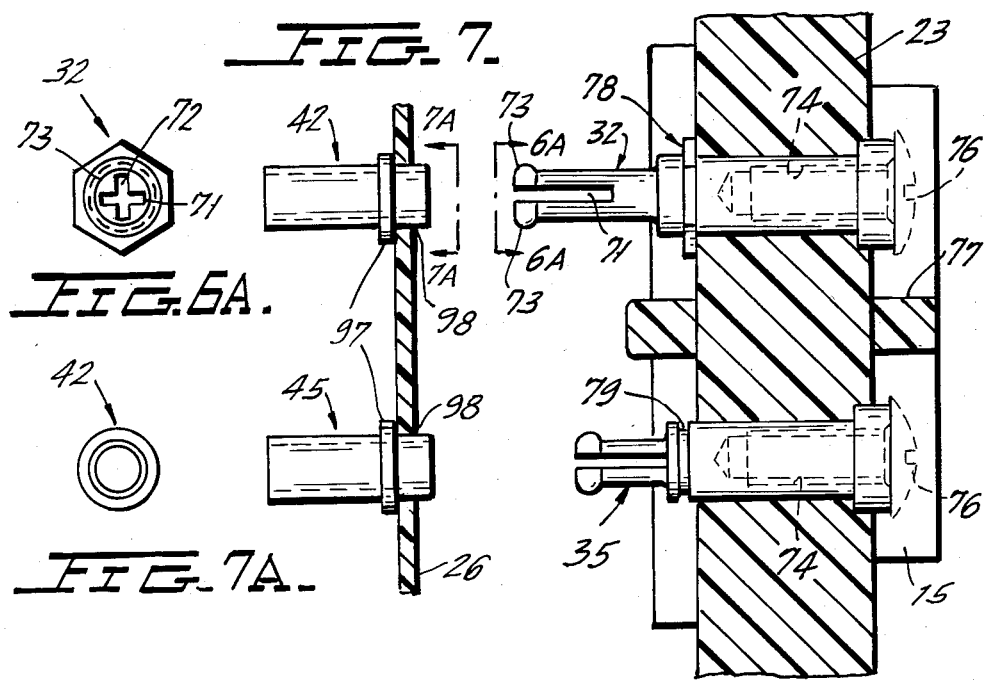

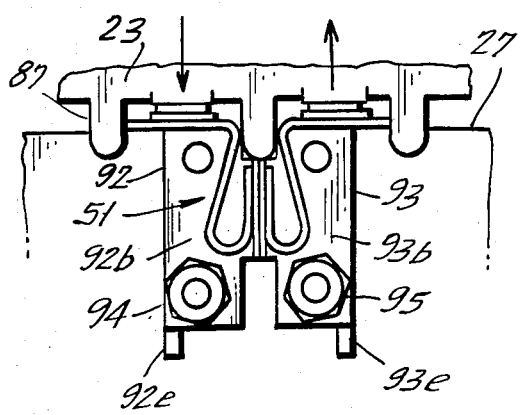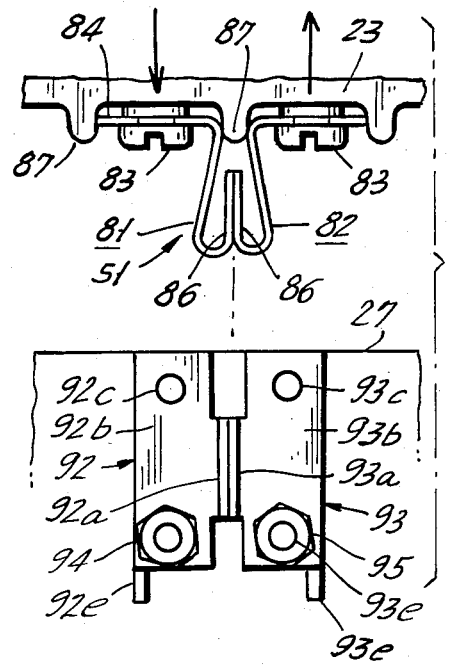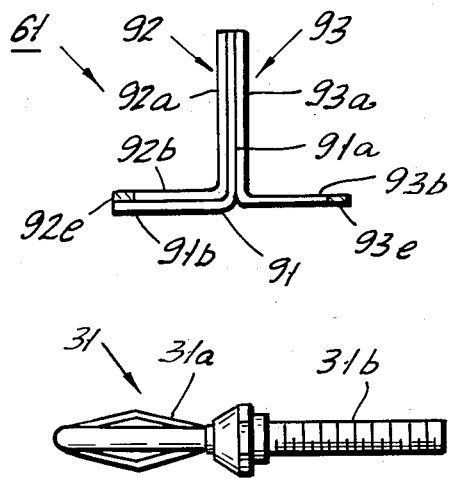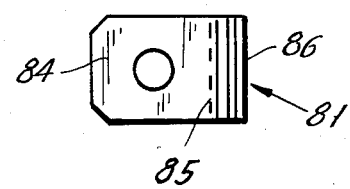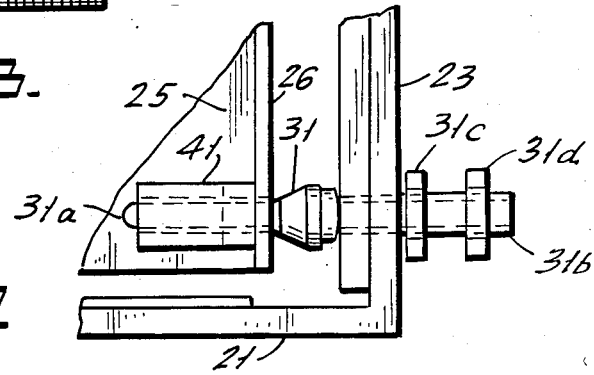

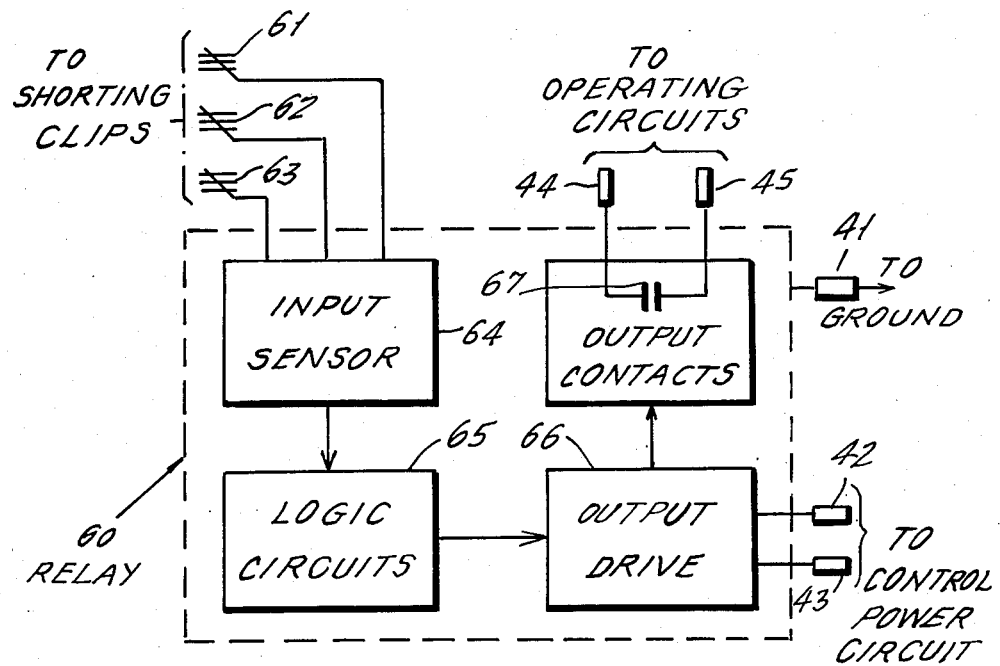
_FIG. 14._

PROTECTIVE RELAY AND DRAWOUT CASE THEREFOR

BACKGROUND OF THE INVENTION

This invention relates to drawout type protective solid state relays.

Often, switchgear equipment is provided with solid state protective relays which are used to monitor currents and/or voltages at strategic points in a power system. Such relays receive secondary signals from current and/or voltage transformers mounted in the power switchgear equipment and function to detect abnormal conditions caused by faults in the power system, such faults including insulation failures. Upon the occurrence of a fault, the protective relay generates a control signal that is used to operate the circuit breaker trip mechanism to open the breaker and deenergize the faulted portion of the power system.

A protective relay of this type is normally tested in order to ensure that it will be available when called on to perform. For the convenience of routine testing, maintenance and replacement of an in service unit, it is the practice to house the protective relay in a drawout case. This feature permits on-site testing or replacement with minimum disruption of power in the power circuit. The case itself serves as a receptacle with terminals for external connection to the relay. The case and relay have mating electrical connections, such that electrical connections are made to the relay when the relay is inserted in the case.

Desirable attributes of a true drawout protective relay wherein the relay case or housing is fixedly mounted in the switchgear are:

1. The ability to reliably and conveniently test all functions of the protective relay, independent of its housing and point of installation.
2. A minimum number of parts remain in the housing when the functional unit is withdrawn therefrom.
3. When the functional unit is withdrawn from its housing, the external circuits are rendered safe.

For reasons of safety, current transformer circuits must be shorted because a current transformer carrying primary current may develop an extremely high secondary voltage when open circuited. Thus, a low impedance load or a short circuit must be connected to the current transformer secondary at all times. It is necessary to disconnect operating circuits before control power is removed from the protective relay in order to prevent false operation of the switchgear equipment. Sufficient dielectric levels must be maintained between voltage circuits that are opened.

While the prior art recognized the necessity of incorporating the foregoing features in protective relays, achievement of these features was accomplished in a cumbersome manner. That is, in one prior art construction, before the protective relay could be withdrawn from its housing, it was necessary to operate a plurality of switches located on the front panel of the relay in order to short current transformer secondaries. In another prior art construction, the drawout section could not be withdrawn until a so-called shorting bar was removed from the front panel. Removal of such shorting bar permitted current transformer shorting contacts to close.

SUMMARY OF THE INVENTION

In accordance with the instant invention, all disconnect and shorting functions are achieved merely by removing the drawout unit from its housing. As will hereinafter be seen, this single operation closes the shorting contacts and disconnects the drawout unit from external operating circuits before the drawout unit is disconnected from the external control power circuit. As a final disconnect function in the drawout sequence, the drawout operating unit is disconnected from ground. When the drawout unit is reinserted in its housing, the reconnect sequence is the reverse of the disconnect sequence so as to prevent false operation or damage.

OBJECTS OF THE INVENTION

Accordingly, the primary object of the instant invention is to provide a compact and reliable drawout type protective relay.

Another object is to provide a protective relay of this type that is convenient to operate and maintain.

Still another object is to provide a protective relay of this type in which transformer secondaries in external sensing circuits are shorted and all electrical connections between the drawout unit and its housing are disconnected merely by removing the drawout unit from the housing.

A further object is to provide a protective relay of this type in which the drawout unit is convenient to test when removed from its housing.

BRIEF DESCRIPTION OF THE DRAWINGS

These objects, as well as other objects of this invention, will be come readily apparent after reading the following description of the accompanying drawings in which:

FIG. 5 is a cross-section of the protective relay showing the housing and frame elements of the drawout unit;

FIG. 6 is a fragmentary vertical section of the terminal block at the rear of the housing;

FIG. 6A is an elevation looking in the direction of arrows 6A—6A of FIG. 6 showing plug-type contacts that are mounted to the housing;

FIG. 7 is a fragmentary vertical section of the rear panel of the drawout unit;

FIG. 7A is an elevation looking in the direction of arrows 7A—7A of FIG. 7, illustrating the receptacle-type contact mounted to the rear of the drawout unit;

FIG. 8 is a top view of a shorting contact pair and its operating blade means, with the former being in open position;

FIG. 9 shows the elements of FIG. 8 with the shorting contact pair closed;

FIG. 10 is a rear elevation of one shorting contact element;

FIG. 11 is a front elevation of the blade means for opening the shorting contact and making electrical connections thereto;

FIG. 12 is a fragmentary elevation of the grounding contact means;

FIG. 13 is an elevation of the plug section for the grounding contact means of FIG. 12;

FIG. 14 is a block diagram of the drawout unit.

DETAILED DESCRIPTION OF THE DRAWINGS

Figure 1:
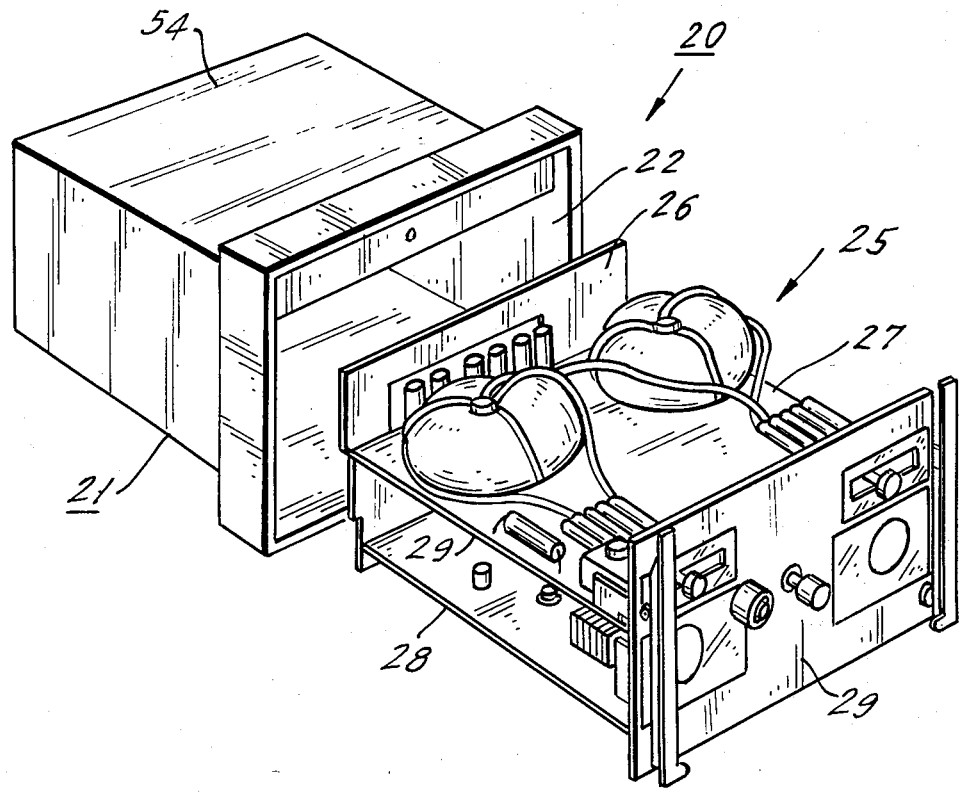
FIG. 1 is a perspective looking toward the front of a protective relay constructed in accordance with the teachings of the instant invention, with the drawout unit removed from its housing.

Now referring to the drawing figures, wherein solid state protective relay 20 is shown as comprising drawout unit 25 and its housing 21. The latter is a generally rectangular unit molded of insulating material and having an open front 22 through which unit 25 is inserted into and withdrawn from housing 21. Mounted to rear wall 23 of housing 21 and extending forward therefrom are nine plug type disconnect contacts 31-39. Contact 31 is relatively long and serves as a ground, contacts 32, 33 are of intermediate length and are connected to a source of control power, typically a rechargeable battery (not shown), and contacts 36-39 are relatively short. Contacts 36, 37 are connectable to an operating circuit external to protective relay 20. With drawout unit 25 inserted fully inside of housing 21, disconnect contacts 31-39 are entered into the respective cooperating sockets of receptacle type contacts 41-49 that are mounted to rear panel 26 of drawout unit 25.

Figure 2:
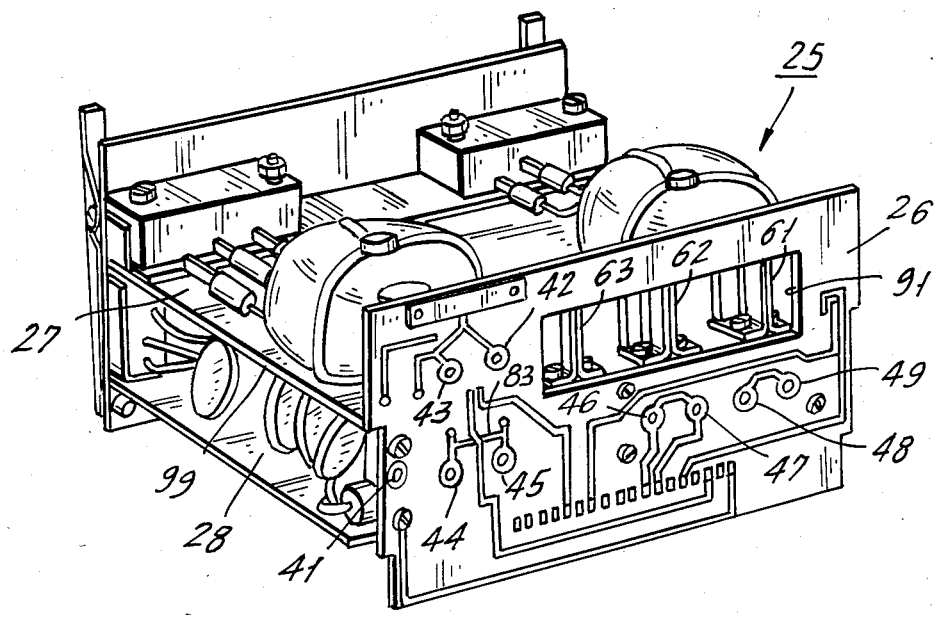
FIG. 2 is a perspective looking at the rear of the drawout unit.
Figure 3:
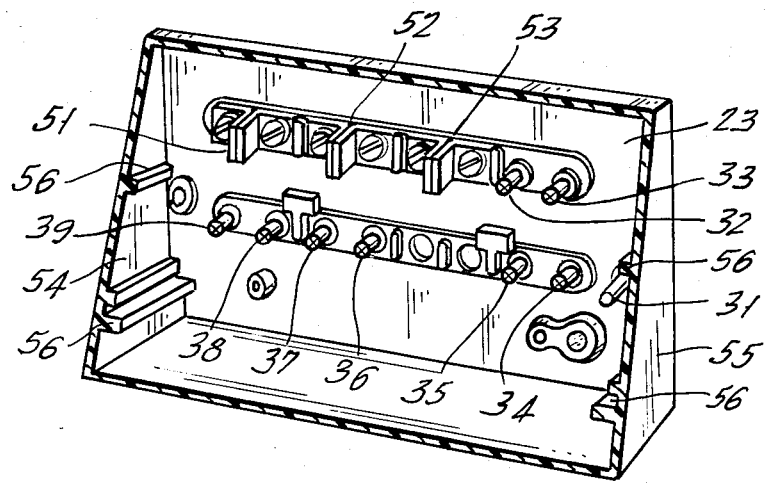
FIG. 3 is a fragmentary perspective looking at the front surface of the housing rear wall.

Also mounted to rear housing wall 23 and projecting forward therefrom are three shorting contact units 51, 52, 53, each of which is biased toward a closed or shorting position and, as will be hereinafter seen, are opened by the respective blades 61, 62, 63 (FIG. 2) of drawout unit 25. Blades 61, 62, 63 are secured to and extend above upper printed circuit board 27 of drawout unit 25.

Each of the respective upper and lower printed circuit boards 27, 28 is generally horizontal and extends between generally vertical rear panel 26, also a printed circuit board, and generally vertical metal control panel 29 at the front of drawout unit 25. Rails 56 formed integrally with side walls 54, 55 of housing 21, and disposed therein, engage the side edges of printed circuit boards 27, 28 to cooperate therewith in guiding drawout unit 25 into its fully inserted position within housing 21. Final guidance on insertion is assisted by the tapered front configuration of grounding contact 31 (FIG. 13) as the latter enters the bore of socket contact 41. Conductor 99 (FIG. 2) printed along one edge of board 27 extends between contact 41 and metal front panel 29.

Contact 31 is a conventional so-called banana jack whose front or contact section 31a consists of a plurality of resilient strips extending in the same direction and bent to form a bulge approximately midway between the ends of front section 31a. Rear section 31b of grounding contact 31 is threaded and extends rearward through rear housing wall 23 where rear section 31b is first engaged by mounting nut 31c FIG. 12) and then by nut 31d for securing a connection (not shown) to an external ground.

Boards 27 and 28 support the circuit elements of solid state relay 60 (FIG. 14) and provide electrical connections between elements thereof. Signals from the external circuit being protected are fed to input sensor 64 of relay 60 through the contact elements of blades 61, 62, 63, and the outputs of sensor 64 are fed to logic circuits 65 for processing. When the latter determine that an abnormal condition exists, the output of logic circuits 65 is fed through output drive 66 to close normally open output contacts 67 which are connected in an operating circuit external to protective relay 20. Typically, the external operating circuit (not shown) includes a trip coil and a source for energizing same.

Figure 4:
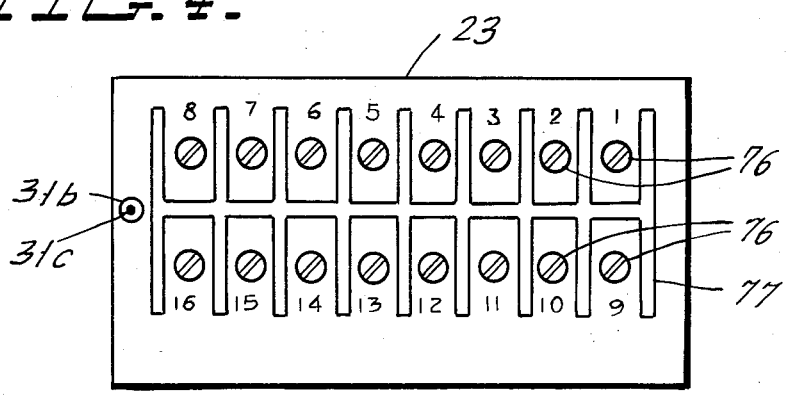
FIG. 4 is a rear elevation of the housing.

The front ends of disconnect contact jacks 32-39 function in the same manner as the front end of grounding contact 31, even though being of slightly different construction. That is, the front end of each contact 32-39 includes four parallel sections formed by crossed, relatively narrow longitudinal cuts 71, 72. While these longitudinal contact sections are normally spaced from one another, they are inwardly deflectable so that their enlarged free ends 73 are biased radially outward to firmly engage the insides of cooperating socket contacts 43-49. Each of the contacts 32-39 is also provided with an internally threaded bore 74 that is open at its rear end to receive a screw 76 (FIG. 4) for making external circuit connections. These screws 76 are disposed within numbered compartments provided by double row terminal strip 77 formed integrally with rear wall 23 and disposed at the rear thereof. For example, as seen in FIG. 6, the head of the respective screws 76 engaged with contacts 32 and 35 are disposed within the respective compartments numbered 7 and 15. Each of the contacts 32-39 is secured to rear wall 23 by a clip-on fastener 78, typically referred to as a "C" ring or snap ring, which is received in annular groove 79 in the shank or mid-region of each contact 32-39. Fastener 78 is adjacent the front surface of wall 23 yet provides a somewhat loose fit between each contact 32-39 and wall 23 to compensate for slight misalignments.

Each of the sockets 42-49 is provided with a collar 97 that abuts the front surface of rear panel 26. The portion of each of these sockets 42-49 rearward of collar 97 extends through a positioning aperture in panel 26 and is secured to a printed circuit element (such as 83 in FIG. 2) by a bead of solder 98 (FIG. 7).

Now referring more particularly to FIGS. 8-11, which illustrate the relationship between one of the shorting contacts 51 and its associated blade means 61. More particularly, shorting contact 51 includes two contact elements 81, 82 mounted to the front surface of housing rear wall 23 by a pair of screws 83, 83. Since elements 81, 82 are of identical construction, only one of them shall be described. Element 81 is generally L-shaped and includes mounting tab 84 which extends at right angles to connecting leg 85. Contact portion 86 is at the end of connecting leg 85 remote from mounting tab 84 and is reversely bent with respect to connecting leg 85 so as to confront the latter and be closely spaced therefrom. This construction permits flexing of element 81 at the bend connection between leg 85 and tab 84 as well as at the bend between connecting leg 85 and contact portion 86. Mounting tab 84 is disposed between adjacent parallel ribs 87, 87, integrally formed with back wall 23 and extending forward thereof. Ribs 87, 87 serve to stabilize element 81 against rotation.

Contact portions 86, 86 of elements 81, 82 are biased toward engagement with one another and are separable by inserting blade means 61 therebetween as in FIG. 8. Blade means 61 is constructed of insulating layer 91a that is disposed between conducting layers 92a, 93a. The latter are the vertical legs of the respective L-shaped conducting elements 92, 93 whose respective horizontal feet 92b, 93b are provided for mounting purposes. Insulating element 91 is an L-shaped element having horizontal mounting foot 91b that is interposed between mounting foot 92b and the upper surface of upper printed circuit board 27. The respective rivets 92c, 93c secure the respective elements 92, 93 to circuit board 27. Additional rivets, not shown, secure socket type test terminals 94, 95 to the respective conducting elements 92, 93 and also secure sockets 94 and 95 directly to the upper surfaces of the respective mounting feet 92b, 93b. The securing means for terminals 94, 95 also engages circuit board 27 to further stabilize the positions of the elements constituting blade means 61. The front of mounting feet 92b, 93b are provided with narrow inclined extensions 92e, 93e that constitute terminals to which crimp type connections are made from circuit elements that are supported by printed circuit boards 27 and/or 28.

With blade means 61 separated from shorting contact means 51, the latter is closed or in shorting condition in that contact portions 86, 86 of elements 81, 82 are in engagement (FIG. 9). With drawout unit 25 fully inserted within its housing, shorting contact means 51 extends through window 91 (FIG. 2) in rear panel 26 and the vertical leg of blade means 61 is positioned between contact portions 86, 86 of the respective elements 81, 82 thereby separating these contact portions. Now conducting blade portions 92a, 93a are in electrical contact with contact portions 86 of the respective elements 81, 82 and these elements are no longer shorted together. Instead, these elements are connected in circuit with elements that constitute portions of drawout unit 25.

Each of the other two blade means 62, 63 is provided with test terminals identical to sockets 94, 95.

Just as grounding receptacle 41 will receive a so-called banana plug connector 31, female type disconnect terminals 42-49 as well as blade means mounted sockets 94, 95 will also receive readily available banana plug connectors thereby facilitating the hookup of test equipment to drawout unit 25. Testing is facilitated by having printed circuit elements and identifying indicia visible at the rear of panel 26.

It should now be apparent to those skilled in the art that all electrical connections between drawout unit 25 and its housing 21 are broken merely by removing unit 25 from housing 21 through front opening 22 thereof. Contact sequencing is such that when unit 25 is withdrawn intermediate length contacts 32, 33 and grounding contact 31 remain in circuit with unit 25 until after the latter is disconnected from short contacts 34-39 and shorting contacts 51-53. Further, during withdrawal of unit 25, intermediate length contacts 32, 33 are disconnected from unit 25 before grounding contact 31 is disconnected therefrom. Upon insertion of unit 25, it connects first with grounding contact 31, then with intermediate length contacts 32, 33, and then with short contacts 34-39 and shorting contacts 51-53, to open the latter.

While this invention has been described in connection with an embodiment having nine sets of disconnect contacts, it should now be apparent to those skilled in the art that it is within the scope of this invention to have more or less than nine sets of disconnect contacts depending upon the electrical design of the drawout unit. In addition, combinations of contact lengths, other than that illustrated and described, may be provided as required to obtain a desired sequence for contact opening and closing.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. Relay apparatus including:
   a drawout unit and a housing having an open front through which said drawout unit is insertable into and removable from said housing;
   said housing including a rear wall opposite said open front;
   said unit including a control panel at the front thereof and a rear panel opposite said front panel;
   a plurality of sets of contact means;
   each of said sets comprising cooperating first and second sections that are engaged with one another when said unit is fully inserted within said housing, said first and second sections being separated by removing said unit from said housing;
   said first sections of a first and second of said sets being mounted on said rear wall and said second sections of said first and second sets being mounted on said rear panel;
   said first and second sets being adapted for connection in respective control power and operating circuits external to said apparatus;
   said first section of a third of said sets comprising shorting contact means biased to shorting position, said second section of said third set being operatively constructed to open said shorting contact means by fully inserting said unit into said housing, and said shorting contact means closing automatically upon disengagement of said blade means therefrom while removing said unit from said housing;
   said second section of said third set being mounted on said unit;
   said first, second and third sets being constructed and operatively mounted so that the first and second sections thereof disengage and engage in sequence as said unit is respectively removed from and fully inserted into said housing;
   said sequence being such that upon withdrawal of said unit from said housing said cooperating sections of said first set separate after separation of said cooperating sections of said second set and after said shorting contact means is in said shorting position;
   said sequence also being such that upon insertion of said unit into said housing said cooperating sections of said first set engage prior to engagement of said cooperating contacts of said second set and prior to opening of said shorting contact means by said second section of said third set.

2. Relay apparatus as set forth in claim 1 in which the shorting contact means includes first and second elements each having a contact portion; said contact portions being biased to engage one another; said second section of the third set including blade means which, upon full insertion of said unit into said housing, assumes a position between said contact portions to thereby open said shorting contact means.

3. Relay apparatus as set forth in claim 2 in which the blade means includes an insulating layer sandwiched between first and second conducting layers that engage the respective first and second contact portions when said unit is disposed within said housing.

4. Relay apparatus as set forth in claim 3 in which the first and second elements are constructed of resilient conducting material and each also having a mounting tab and a connecting leg interposed between said tab and said contact portion with the latter being reversely bent to confront the connecting leg; said tab being generally perpendicular to said connecting leg.

5. Relay apparatus as set forth in claim 4 in which the rear wall is provided with a plurality of forwardly extending parallel ribs; each of said tabs being disposed between two of said ribs.

6. Relay apparatus as set forth in claim 3 in which the housing is a molded insulating structure.

7. Relay apparatus as set forth in claim 3 in which the blade means is disposed forward of the rear panel and the latter is provided with window means through which the shorting contact means projects when the unit is disposed fully within the housing.

8. Relay apparatus as set forth in claim 1 in which a fourth of said sets is adapted for connection to a ground external of said apparatus;

said first section of said fourth set being mounted on said rear wall and said second section of said fourth set being mounted on said unit;

said fourth set being constructed and operatively mounted so that the first and second sections thereof are disengaged and engaged when said unit is respectively removed from and fully inserted into said housing;

said sequence being such that upon withdrawal of said unit from said housing said cooperating sections of said fourth set separate after separation of said cooperating sections of said first set, and upon insertion of said unit into said housing said cooperating sections of said fourth set engage prior to engagement of said cooperating sections of said first set.

9. Relay apparatus as set forth in claim 1 in which the first sections of said first and second sets each include a plug-type contact that extends forward from said rear wall, and said second;

said second sections of said first and second sets each having a socket positioned to receive the plug-type contacts when the unit is fully inserted into said housing.

10. Relay apparatus as set forth in claim 3 also including first and second mounting legs projecting from the respective first and second layers;

first and second sockets connected directly to the respective said first and second layers and constituting receptacle-type connecting points used for electrically testing of said unit.

* * * * *